(12) United States Patent
Ruhland et al.

(10) Patent No.: US 11,610,792 B2
(45) Date of Patent: Mar. 21, 2023

(54) HEATED SUBSTRATE SUPPORT WITH THERMAL BAFFLES

(71) Applicant: APPLIED MATERIALS, INC., Santa Clara, CA (US)

(72) Inventors: Fred Eric Ruhland, Pleasanton, CA (US); Sumit S. Patankar, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 22 days.

(21) Appl. No.: 16/991,356

(22) Filed: Aug. 12, 2020

(65) Prior Publication Data

US 2021/0050234 A1 Feb. 18, 2021

Related U.S. Application Data

(60) Provisional application No. 62/887,951, filed on Aug. 16, 2019.

(51) Int. Cl.
*H01L 21/67* (2006.01)
*H01L 21/673* (2006.01)

(52) U.S. Cl.
CPC .......... *H01L 21/67109* (2013.01); *H01L 21/67389* (2013.01)

(58) Field of Classification Search
CPC ......... H01L 21/67109; H01L 21/67389; H01L 21/67103
See application file for complete search history.

(56) References Cited

U.S. PATENT DOCUMENTS

| 6,182,602 B1 * | 2/2001 | Redeker | H01J 37/32449 |
| | | | 118/728 |
| 6,280,584 B1 * | 8/2001 | Kumar | H02N 13/00 |
| | | | 204/192.12 |
| 9,905,443 B2 * | 2/2018 | Subramani | C23C 14/541 |
| 2002/0129475 A1 * | 9/2002 | Tsai | C23C 16/4586 |
| | | | 29/25.01 |
| 2003/0003749 A1 * | 1/2003 | Sexton | H01L 21/6831 |
| | | | 438/694 |

(Continued)

FOREIGN PATENT DOCUMENTS

| CN | 101243536 A | * | 8/2008 | ........ H01J 37/32009 |
| CN | 102844854 B | * | 4/2016 | ........... C23C 16/458 |

(Continued)

OTHER PUBLICATIONS

International Search Report for PCT/US2020/046136, dated Nov. 25, 2020.

*Primary Examiner* — Mohammed Shamsuzzaman
(74) *Attorney, Agent, or Firm* — Moser Taboada

(57) ABSTRACT

Embodiments of substrate supports for use in a process chamber are provided herein. In some embodiments a substrate support for use in a process chamber includes a pedestal having an upper surface for supporting a substrate and an opposite lower surface, a first heater disposed within the pedestal between the upper surface and the lower surface, and thermal baffles having a plurality of voids that are fluidly isolated from each other disposed between the first heater and the lower surface to reduce heat transfer from the first heater to the lower surface of the pedestal.

15 Claims, 4 Drawing Sheets

(56) References Cited

U.S. PATENT DOCUMENTS

| | | | |
|---|---|---|---|
| 2005/0078953 A1* | 4/2005 | Fodor | C23C 16/46 |
| | | | 392/418 |
| 2006/0076109 A1* | 4/2006 | Holland | H01L 21/67248 |
| | | | 118/724 |
| 2006/0113290 A1* | 6/2006 | Shareef | B23K 26/703 |
| | | | 219/121.65 |
| 2009/0235866 A1 | 9/2009 | Kataigi et al. | |
| 2009/0280248 A1* | 11/2009 | Goodman | H01L 21/68757 |
| | | | 118/728 |
| 2010/0101771 A1* | 4/2010 | Roy | H01L 21/67109 |
| | | | 165/80.4 |
| 2012/0285658 A1* | 11/2012 | Roy | H01L 21/68785 |
| | | | 165/47 |
| 2015/0380220 A1 | 12/2015 | Tan et al. | |
| 2017/0215230 A1* | 7/2017 | Parkhe | H05B 1/0233 |
| 2018/0337074 A1* | 11/2018 | Samir | H01L 21/67109 |
| 2019/0013231 A1 | 1/2019 | Yamaguchi et al. | |
| 2019/0267218 A1* | 8/2019 | Wang | H01L 21/6831 |
| 2020/0090972 A1* | 3/2020 | Benjaminson | H01L 21/6833 |
| 2020/0286717 A1* | 9/2020 | Cho | H01J 37/32724 |
| 2021/0035844 A1* | 2/2021 | Cho | H01L 21/68721 |
| 2021/0066050 A1* | 3/2021 | Babu | H01J 37/32715 |
| 2021/0066051 A1* | 3/2021 | Babu | H01J 37/32495 |
| 2021/0176831 A1* | 6/2021 | Lei | C23C 16/4586 |

FOREIGN PATENT DOCUMENTS

| | | | | |
|---|---|---|---|---|
| JP | 4723086 B2 * | 7/2011 | | C23C 16/4586 |
| JP | 2016-100349 A | 5/2016 | | |
| JP | 2019009424 A * | 1/2019 | | H01J 37/32715 |
| JP | 6666900 B2 * | 3/2020 | | H01J 37/32082 |
| KR | 10-2017-0073333 A | 6/2017 | | |
| WO | WO-9949501 A2 * | 9/1999 | | C23C 16/4586 |
| WO | WO-2020227408 A1 * | 11/2020 | | H01J 37/32697 |

* cited by examiner

HEATED SUBSTRATE SUPPORT WITH THERMAL BAFFLES

CROSS-REFERENCE TO RELATED APPLICATIONS

This application claims benefit of U.S. provisional patent application Ser. No. 62/887,951, filed Aug. 16, 2019 which is herein incorporated by reference in its entirety.

FIELD

Embodiments of the present disclosure generally relate to substrate processing equipment and, more specifically, to substrate supports for use in substrate processing equipment.

BACKGROUND

Substrate processing equipment generally includes a process chamber configured to perform certain processes on a substrate, for example, chemical vapor deposition, atomic layer deposition, annealing, or the like. Substrate supports for use in the process chamber typically include a pedestal to support a substrate coupled to a hollow shaft that provides a conduit for fluids, power, gas, or the like to the pedestal. The pedestal may also include a heater embedded therein to provide heat to the substrate for certain substrate processes. With conventional pedestals, the inventors have observed that heat from the heater is transferred away from the substrate, resulting in heat loss to a bottom surface of the pedestal and the shaft. Also, with conventional pedestals, the inventors have observed that temperature varies across an upper surface of the pedestal.

Accordingly, the inventors have provided embodiments of improved substrate supports.

SUMMARY

Embodiments of substrate supports for use in a process chamber are provided herein. In some embodiments a substrate support for use in a process chamber includes a pedestal having an upper surface for supporting a substrate and an opposite lower surface, a first heater disposed within the pedestal between the upper surface and the lower surface, and thermal baffles having a plurality of voids that are fluidly isolated from each other disposed between the first heater and the lower surface to reduce heat transfer from the first heater to the lower surface of the pedestal.

In some embodiments, a substrate support for use in a process chamber includes a first plate having an upper surface for supporting a substrate and a lower surface opposite the upper surface; a second plate having an upper surface coupled to the lower surface of the first plate and a lower surface opposite the upper surface, wherein the second plate includes a first heater embedded therein; a third plate coupled to the second plate, wherein the third plate includes thermal baffles comprising a plurality of voids disposed within the third plate; and a first gas channel extending from a lower surface of the third plate to the upper surface of the first plate via the second plate.

In some embodiments, a process chamber includes a chamber body defining an interior volume; and a substrate support at least partially disposed in the interior volume and including a pedestal coupled to a hollow shaft, wherein the pedestal includes a first plate having an upper surface for supporting a substrate and a lower surface opposite the upper surface; a second plate having an upper surface coupled to the lower surface of the first plate and a lower surface opposite the upper surface, wherein the second plate includes a first heater embedded therein; a third plate coupled to the second plate, wherein the third plate includes thermal baffles comprising a plurality of voids disposed within the third plate and a lower surface coupled to the hollow shaft; and a first gas channel extending from a lower surface of the third plate to the upper surface of the first plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
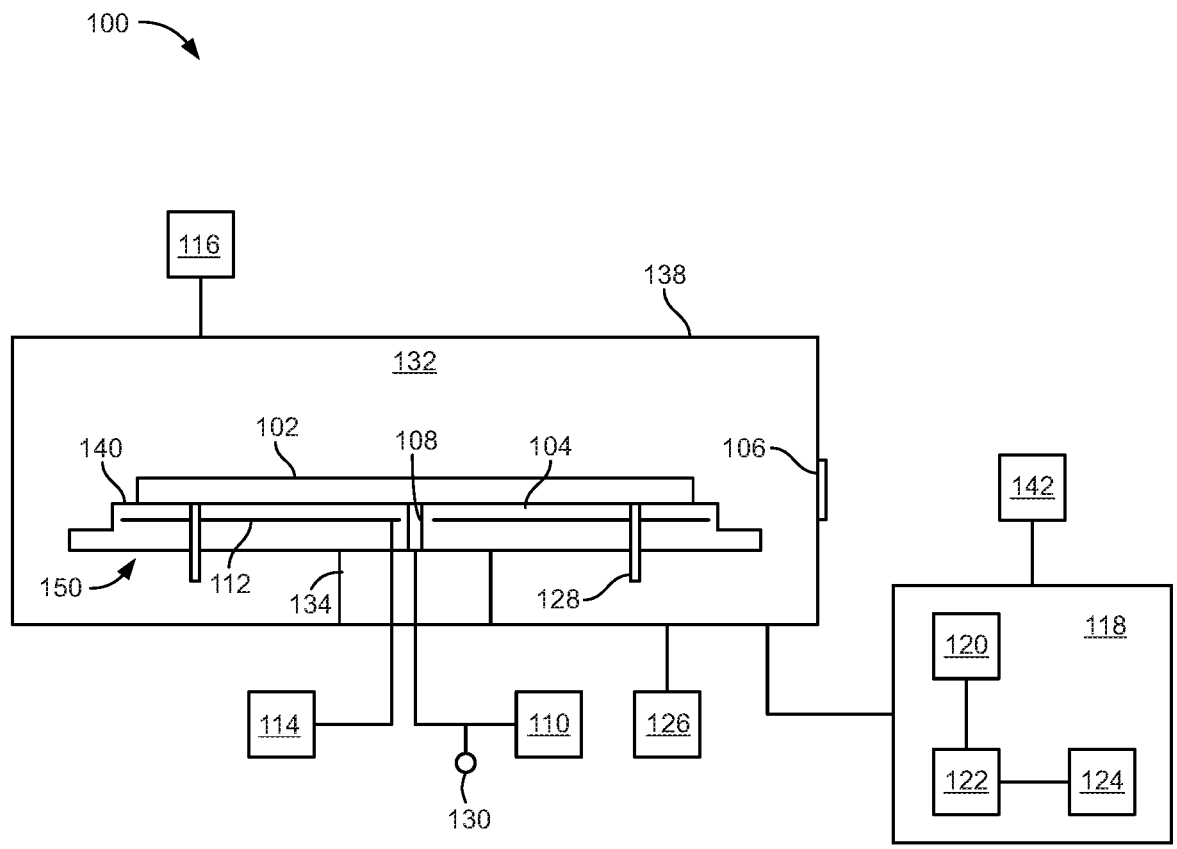
FIG. 1 is a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports having a heater embedded in the substrate support are provided herein. In some embodiments, the substrate support includes a pedestal coupled to a hollow shaft. The pedestal includes an upper surface to support a substrate. The substrate support further includes thermal baffles disposed between the heater and a lower surface of the pedestal to reduce heat transfer from the heater to the lower surface of the pedestal and the hollow shaft. The thermal baffles advantageously reduce heat loss to the lower surface of the pedestal and increase heat transfer to an upper surface of the pedestal.

FIG. 1 is a schematic side view of a process chamber 100 in accordance with at least some embodiments of the present disclosure. The configuration and arrangement of components of the process chamber 100 shown in FIG. 1 is merely exemplary and not meant to be limiting. In addition, conventional components or other details not necessary for the understanding of the disclosure may be omitted from or simplified in the Figures so as not to obscure the disclosure.

In addition, relative positional terminology such as upper, lower, top, bottom, and the like, as used in the disclosure, are relative to the orientation in drawings and not meant to be limiting. For example, the substrate support and components described may be provided in other orientations.

As depicted in FIG. 1, the process chamber 100 includes a chamber body 138 having an interior volume 132. A substrate support 150 is disposed in the interior volume 132. The substrate support 150 may generally comprise a pedestal 140 and a hollow shaft 134 for supporting the pedestal 140. In some embodiments, the pedestal 140 is circular in shape. In some embodiments, the pedestal 140 is made of stainless steel. The hollow shaft 134 provides a conduit to provide, for example, backside gases, process gases, vacuum chucking, fluids, coolants, power, or the like, to the pedestal 140.

A substrate 102 is shown disposed on the pedestal 140. In some embodiments, the substrate support 150 is coupled to a gas element 110. In some embodiments, the substrate support 150 is a vacuum chuck and the gas element 110 is a vacuum pump or other suitable vacuum source. In such embodiments, a vacuum region 104 is formed between an upper surface of the pedestal 140 and the substrate 102. In some embodiments, a pressure sensor, such as a pressure gauge 130 is operatively coupled to the vacuum region 104 to measure the backside pressure in the vacuum region 104. In some embodiments, the gas element 110 is a gas supply configured to provide a backside gas to an upper surface of the pedestal 140. In some embodiments, the pedestal 140 includes a first gas channel 108 to provide at least one of vacuum pressure or backside gas to an upper surface of the pedestal 140. The substrate support 150 includes a first heater 112, such as a resistive heater, coupled to a heater power source 114.

The chamber body 138 includes an opening, such as a slit valve 106 that selectively opens the chamber body 138 to facilitate moving substrates into and out of the interior volume 132 of the chamber body 138, for example, via a substrate transfer robot 142. In some embodiments, control of the substrate transfer robot 142 facilitates control of the position of the substrate 102 over the substrate support 150, and ultimately, of the position of the substrate 102 on the substrate support 150 when transferred from the substrate transfer robot 142 to the substrate support 1500. A plurality of lift pins 128 may be provided to assist in the transfer of the substrate 102 between the substrate transfer robot 142 and the substrate support 150.

The process chamber 100 is configured for performing one or more of a variety of processes, such as deposition processes. A gas source 116 is coupled to the interior volume 132 of the chamber body 138 to provide process gases needed for substrate processing (e.g., deposition). In some embodiments, the gas source 116 also provides at least one inert gas, such nitrogen gas or a noble gas (such as argon or the like) to maintain a desired pressure within the process chamber and to remove process gases and processing byproducts during processing. A pump 126 is coupled to the interior volume 132 to maintain a desired pressure within the chamber body 138 and to remove process gases and processing byproducts during processing.

In some embodiments, to facilitate control of the process chamber 100, a controller 118 is coupled to components of the process chamber 100, including the pressure gauge 130, the substrate transfer robot 142, and the like. The controller 118 may be any form of general-purpose computer processor that can be used in an industrial setting for controlling various chambers and sub-processors. The controller includes a central processing unit (CPU) 120, memory 122, and support circuits 124. The memory, or computer-readable medium, 122 of the CPU 120 may be one or more of readily available memory such as random access memory (RAM), read only memory (ROM), floppy disk, hard disk, or any other form of digital storage, local or remote. The support circuits 124 are coupled to the CPU 120 for supporting the processor.

Figure 2:
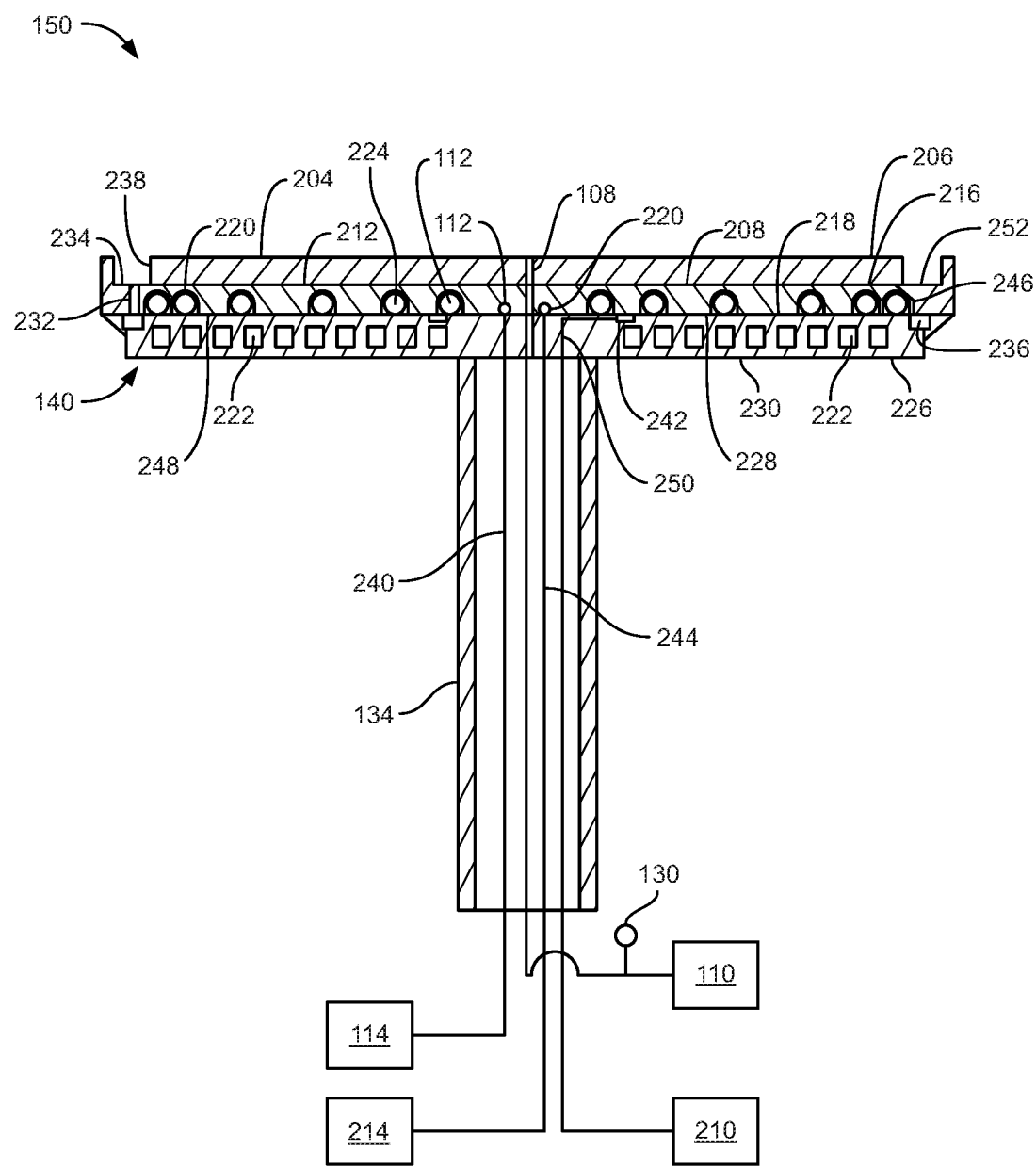
FIG. 2 is a schematic cross-sectional side view of a substrate support in accordance with at least some embodiments of the present disclosure.

FIG. 2 is a schematic cross-sectional side view of a substrate support in accordance with at least some embodiments of the present disclosure. In some embodiments, the pedestal 140 of the substrate support 150 includes an upper surface 204 for supporting the substrate 102, a first heater 112 disposed beneath the support surface, and thermal baffles 222 disposed beneath the first heater 112. In some embodiments, the thermal baffles 222 can be disposed at least between the first heater 112 and a lower surface of the pedestal 140 (e.g., the bottom of the pedestal).

In some embodiments, the pedestal 140 comprises a plurality of plates that are coupled together, for example, brazed, vacuum brazed, welded, bolted, clamped, or otherwise fastened together. For example, as shown in FIG. 2, the pedestal 140 includes a first plate 206, a second plate 216, and a third plate 226. The first plate 206 includes the upper surface 204 for supporting the substrate 102 and a lower surface 212 opposite the upper surface 204. In some embodiments, the first plate 206 has a circular shape. In some embodiments, the first plate 206 comprises stainless steel.

In some embodiments, the first plate 206 includes a plurality of gas channels 232 through the first plate 206 terminating in a plurality of edge holes 234 disposed about a peripheral region of the first plate 206. In some embodiments, the plurality of edge holes 234 are equidistantly spaced from each other. The plurality of gas channels 232 are fluidly coupled to a gas supply 210 to provide a purge gas to an edge of the substrate. In some embodiments, the first plate 206 includes an annular groove 238 in the peripheral region and the plurality of edge holes 234 are disposed in a surface 252 formed by the annular groove 238. For example, the plurality of edge holes 234 may be disposed along a bottom of the annular groove 238.

The pedestal 140 includes a second plate 216 having an upper surface 208 coupled to the lower surface 212 of the first plate 206 and a lower surface 218 opposite the upper surface 208. In some embodiments, the lower surface 212 of the first plate 206 includes a recess 246 and the second plate 216 is disposed in the recess 246. In some embodiments, the recess 246 includes angled sidewalls and the second plate 216 is shaped to conform to and fill the recess 246. In some embodiments, the second plate 216 is disposed in the recess 246 so that a lower surface 218 of the second plate 216 is coplanar with the lower surface 212 of the first plate 206. In some embodiments, the second plate 216 comprises stainless steel.

The second plate 216 includes a heater (e.g., the first heater 112) coupled to the heater power source 114 via leads 240. In some embodiments, the first heater 112 is embedded in the second plate 216. In some embodiments, the second plate 216 includes a second heater 220, such as a resistive heater. The second heater 220 may be coupled to the heater power source 114 or to a second heater power source 214 via leads 244. In some embodiments, the second heater 220 is embedded in the second plate 216. In some embodiments, a channel or groove 224 is disposed in the lower surface 218 of the second plate 216. In some embodiments, the first heater 112 is disposed in the groove 224. In some embodiments, the second heater 220 is disposed in the groove 224.

In some embodiments, the first heater 112 and the second heater 220 are disposed in the groove 224.

The pedestal 140 includes a third plate 226 having an upper surface 228 coupled to the second plate 216. In some embodiments, the thermal baffles 222 can be disposed in the third plate 226. The thermal baffles 222 disposed within the third plate 226 reduce heat transfer from the first heater 112 (or first and second heaters 112, 220) to a lower surface 230 of the third plate 226. In some embodiments, the thermal baffles 222 are thin-walled with a plurality of voids to minimize heat transfer through the walls of the thermal baffles 222. For example, the thermal baffles 222 can be arranged in a thin-walled honeycomb shape, although other shapes can be used.

In some embodiments, thin-walled refers to having a thickness that is less than a height of the wall, such as a thickness that is less than 50 percent of a height of the wall, or less than 40 percent of the height of the wall, or less than 30 percent of the height of the wall, or less than 20 percent of the height of the wall, or less than 10 percent of the height of the wall, or less than 5 percent of the height of the wall. In some embodiments, the thermal baffles 222 have a height of about 0.25 inches to about 0.6 inches.

In some embodiments, thin-walled refers to having a wall thickness of about 0.02 inches to about 0.1 inches. In some embodiments, a diameter of each of the plurality of voids is about 0.3 inches to about 0.8 inches. In some embodiments, the plurality of voids comprise about 60 percent to about 95 percent of a total surface area of the thermal baffles 222 (e.g., the surface area measured along the top or bottom surface of the thermal baffle 222 is about 5 to about 40 percent of the total surface area if the voids were not present). In some embodiments, the thermal baffles 222 can be disposed at least between the first heater 112, and the second heater 220 when present, and a lower surface of the pedestal 140 (e.g., the lower surface 230 of the third plate 226). In some embodiments, the third plate 226 comprises stainless steel. The lower surface of the pedestal 140 (e.g., the lower surface 230 of the third plate 226) is coupled to the hollow shaft 134.

In some embodiments, the first gas channel 108 extends through the third plate 226, the second plate 216, and the first plate 206, to provide at least one of backside gas or vacuum chucking to the substrate. In some embodiments, a second gas channel 250 (further described in FIG. 5) extends from an inlet at the lower surface 230 of the third plate 226 to the plurality of edge holes 234 of the first plate 206. In some embodiments, the second gas channel 250 includes one or more annular channels to distribute gas from the inlet to the plurality of edge holes 234. In some embodiments, the second gas channel 250 includes an annular gas channel 236 formed in a peripheral region of the third plate 226 and fluidly coupled to the plurality of edge holes 234. In some embodiments, the second gas channel 250 includes a second annular gas channel 242 formed in a central region of the third plate 226 and fluidly coupled to the annular gas channel 236 via a plurality of radial gas channels (see FIG. 5). In some embodiments, the second gas channel 250 is fluidly independent from the first gas channel 108.

In some embodiments, a diaphragm 248 is disposed between the third plate 226 and the second plate 216 to reduce or prevent gas leakage from the annular gas channel 236 or the second annular gas channel 242. In some embodiments, the diaphragm 248 comprises a thin sheet of stainless steel.

Figure 3:
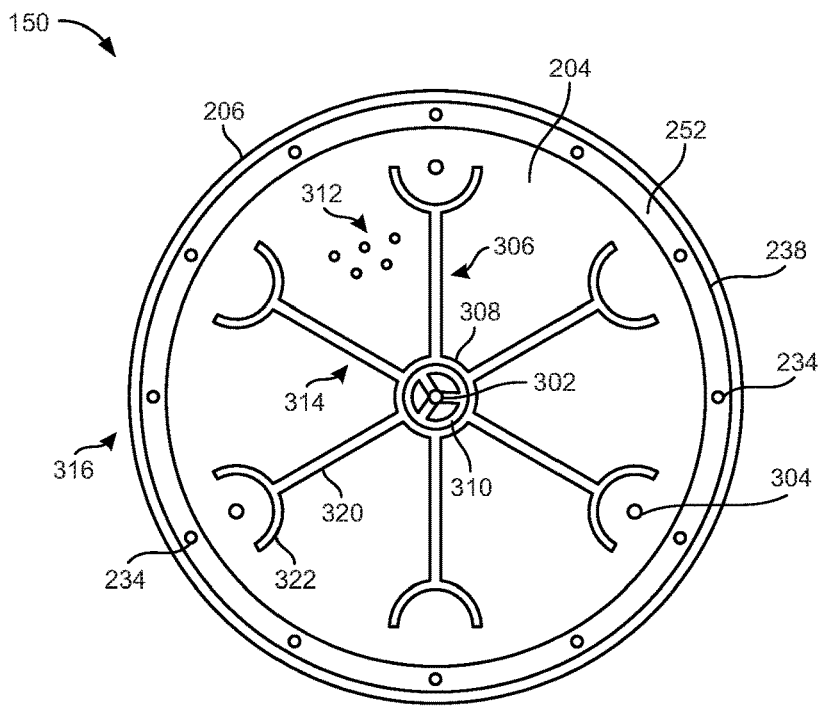
FIG. 3 is a top view of a substrate support in accordance with at least some embodiments of the present disclosure.

FIG. 3 is a top view of a substrate support in accordance with at least some embodiments of the present disclosure. The first plate 206 includes a central region 314 and a peripheral region 316. In some embodiments, a gas opening 302 is disposed in the central region 314 and is fluidly coupled to the first gas channel 108 to provide at least one of backside gas or vacuum chucking to the substrate 102. In some embodiments, the upper surface 204 of the first plate 206 includes gas grooves 306 having any suitable pattern and fluidly connected to the gas opening 302. A shown in FIG. 3, the gas grooves 306 comprise an annular gas groove 308 disposed about the gas opening 302 and a plurality of spokes 320 extending radially outward from the gas opening 302. In some embodiments, each spoke of the plurality of spokes 320 terminates with a curved groove 322. In some embodiments, the plurality of spokes 320 comprises six spokes.

In some embodiments, the upper surface 204 of the first plate 206 includes a plurality of first raised features 310 disposed between the gas opening 302 and the plurality of spokes 320. In some embodiments, the upper surface 204 includes a plurality of second raised features 312 disposed radially outward of the annular gas groove 308. The plurality of first raised features 310 and the plurality of second raised features 312 are raised slightly from the upper surface 204 and are configured to provide a minimum contact area between the substrate 102 and the pedestal 140 while maintaining high thermal conductivity therebetween. In some embodiments, the pedestal 140 includes one or more lift pin openings 304 to accommodate lift pins (e.g., lift pins 128).

Figure 4:
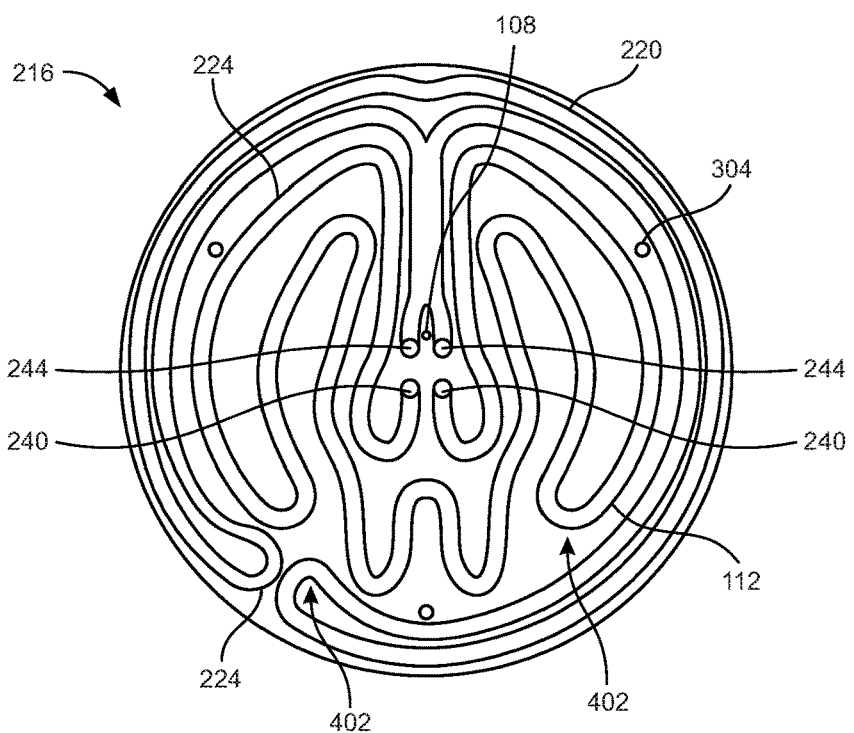
FIG. 4 is a bottom view of a portion of a substrate support in accordance with at least some embodiments of the present disclosure.

FIG. 4 is a bottom view of a second plate in accordance with at least some embodiments of the present disclosure. In some embodiments, the first heater 112 is configured to heat a central region 314 of the first plate 206 and the second heater 220 is configured to heat a peripheral region 316 of the first plate 206 independently of the first heater 112. In some embodiments, the first heater 112 comprises a resistive heating element disposed in a metal tube with an isolator disposed therebetween. In some embodiments, the second heater 220 comprises a resistive heating element disposed in a metal tube with an isolator disposed therebetween. In some embodiments, the leads 240 and the leads 244 are coupled to the first heater 112 and the second heater 220, respectively at a central region of the second plate 216. In some embodiments, the first heater 112 and the second heater 220 extend in a tortuous path about the second plate 216 to advantageously provide more uniform heating to the substrate 102. In some embodiments, the tortuous path comprises a plurality of bends 402. In some embodiments, the first gas channel 108 extends between the pair of leads 244.

Figure 5:
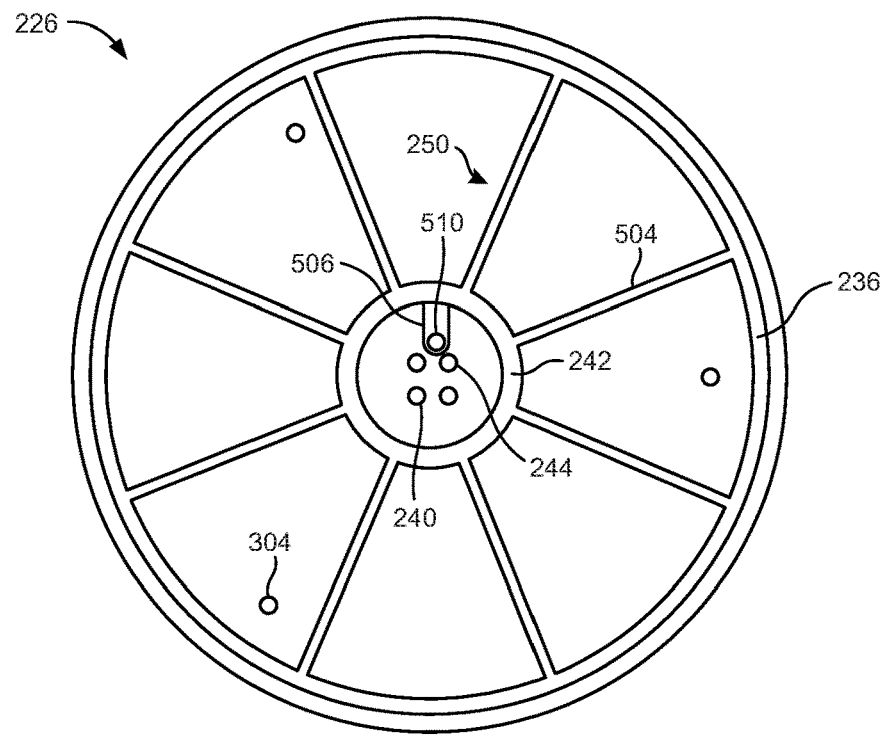
FIG. 5 is a top view of a portion of a substrate support in accordance with at least some embodiments of the present disclosure.

FIG. 5 is a top view of a third plate in accordance with at least some embodiments of the present disclosure. In some embodiments, the second gas channel 250 extends from a lower surface 230 of the third plate 226 to a gas opening 510 disposed on the upper surface 228 of the third plate 226. In some embodiments, the gas opening 510 is disposed in a slot 506 formed on the upper surface 228. In some embodiments, the slot 506 extends between the gas opening 510 and the second annular gas channel 242 disposed in a central region of the third plate 226. In some embodiments, a plurality of radial gas channels 504 are formed on the upper surface 228 of the third plate 226 and extend from the second annular gas channel 242 to the annular gas channel 236 disposed in a peripheral region of the third plate 226. In some embodiments, the plurality of radial gas channels 504 comprise eight radial gas channels. In some embodiments, the second gas channel 250 extends from the lower surface 230 of the third plate 226 to the plurality of edge holes 234 via the gas opening 510, the slot 506, the second annular gas channel 242, the plurality of radial gas channels 504, the annular gas channel 236 and the plurality of gas channels 232.

Figure 6:
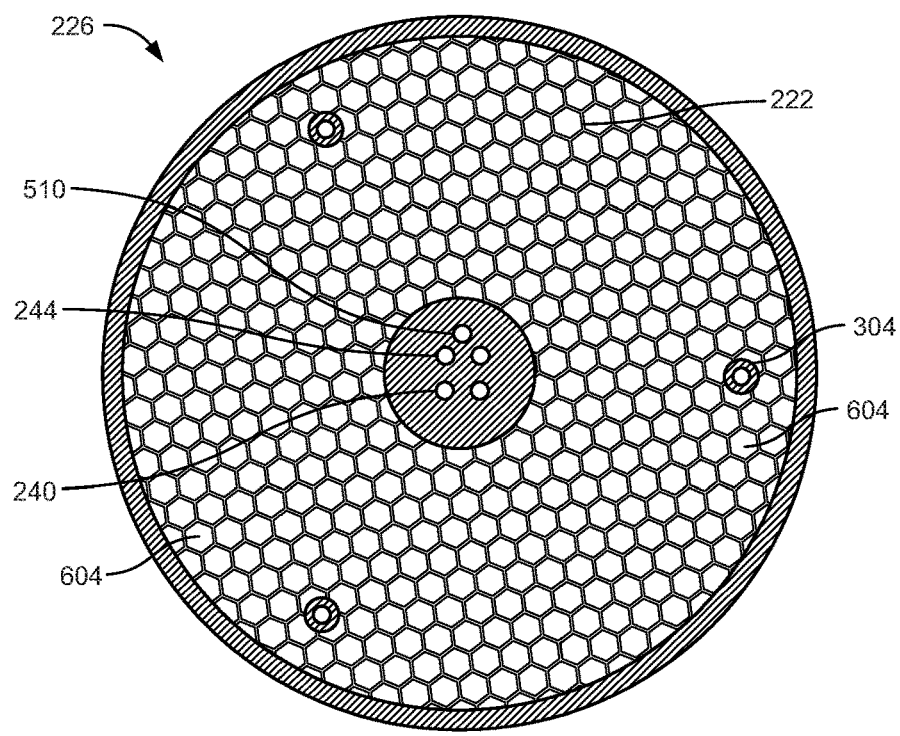
FIG. 6 is a cross sectional top view of portion of a substrate support in accordance with at least some embodiments of the present disclosure.

FIG. 6 is a cross sectional top view of the third plate in accordance with at least some embodiments of the present disclosure. In some embodiments, the thermal baffles 222 comprise a plurality of voids 604 that are fluidly isolated from each other. In some embodiments, the thermal baffles 222 are thin-walled to minimize heat transfer through the walls of the thermal baffles 222. For example, the thermal baffles 222 can be arranged in a thin-walled honeycomb shape, although other shapes can be used. The thin-walled shape of the thermal baffles 222 advantageously reduces heat transfer from the second plate 216 to the lower surface 230 of the third plate 226. While FIG. 6 depicts the thermal baffles 222 forming a hexagon shape, the thermal baffles 222 can be any suitable shape, for example, a polygon shape, a regular polygon shape, or the like. In some embodiments, the third plate 226 is fabricated via 3D printing to fabricate the third plate 226 in an economical manner as compared to machining the third plate 226. In addition, 3D printing enables fabrication of the thermal baffles 222 in shapes that may be unfeasible or impossible to form using other fabrication techniques. In some embodiments, the third plate 226 is fabricated via 3D printing onto the lower surface 230 of the third plate 226 that is pre-machined. In some embodiments, the third plate 226, including the lower surface 230 of the third plate 226, is fabricated via 3D printing.

While the foregoing is directed to embodiments of the present disclosure, other and further embodiments of the disclosure may be devised without departing from the basic scope thereof.

The invention claimed is:

1. A substrate support for use in a process chamber, comprising:
a pedestal having an upper surface for supporting a substrate and an opposite lower surface, a first heater disposed within the pedestal between the upper surface and the lower surface, and thermal baffles having a plurality of voids that are fluidly isolated from each other disposed between the first heater and the lower surface to reduce heat transfer from the first heater to the lower surface of the pedestal,
wherein the pedestal includes a first plate having the upper surface for supporting the substrate and a lower surface opposite the upper surface, a second plate coupled to the lower surface of the first plate, wherein the second plate includes the first heater embedded therein, and a third plate coupled to the second plate, wherein the thermal baffles are disposed within the third plate,
wherein the first plate includes a plurality of gas channels through the first plate terminating in a plurality of edge holes disposed about a peripheral region to provide a purge gas to an edge of the substrate, and
wherein the plurality of edge holes are fluidly coupled to an annular gas channel disposed in the third plate, and wherein the third plate includes a plurality of radial gas channels that extend from a central region of the third plate to the annular gas channel.

2. The substrate support of claim 1, further comprising a second heater disposed in the pedestal between the upper surface and the lower surface, wherein the second heater is configured to heat a peripheral region of the first plate.

3. The substrate support of claim 1, wherein the first heater is disposed in a groove formed on the lower surface of the second plate.

4. The substrate support of claim 1, wherein the lower surface of the first plate includes a recess and the second plate is disposed in the recess so that a lower surface of the second plate is coplanar with the lower surface of the first plate.

5. The substrate support of claim 1, further comprising a first gas channel extending through the pedestal, wherein the upper surface of the pedestal includes gas grooves fluidly coupled to the first gas channel to provide at least one of backside gas or vacuum chucking to the substrate.

6. The substrate support of claim 1, wherein the pedestal comprises stainless steel.

7. A substrate support for use in a process chamber, comprising:
a first plate having an upper surface for supporting a substrate and a lower surface opposite the upper surface;
a second plate having an upper surface coupled to the lower surface of the first plate and a lower surface opposite the upper surface, wherein the second plate includes a first heater embedded therein;
a third plate coupled to the second plate, wherein the third plate includes thermal baffles comprising a plurality of voids disposed within the third plate;
a first gas channel extending from a lower surface of the third plate to the upper surface of the first plate via the second plate; and
a second gas channel extending from the lower surface of the third plate to a plurality of edge holes in a peripheral region of the first plate to provide a purge gas to an edge of the substrate, wherein the second gas channel includes a plurality of radial gas channels extending from a central region of the third plate to an annular gas channel in a peripheral region of the third plate and a plurality of channels extending from the annular gas channel to corresponding ones of the plurality of edge holes.

8. The substrate support of claim 7, wherein the first plate includes an annular groove in the peripheral region and the plurality of edge holes are disposed in a surface formed by the annular groove.

9. The substrate support of claim 7, further comprising a diaphragm disposed between the third plate and the second plate and configured to reduce or prevent gas leakage from the annular gas channel.

10. The substrate support of claim 7, wherein the thermal baffles include a plurality of voids that comprise about 60 percent to about 95 percent of a total surface area of the thermal baffles.

11. A process chamber, comprising:
a chamber body defining an interior volume; and
the substrate support of claim 1 at least partially disposed in the interior volume, the pedestal coupled to a hollow shaft.

12. The process chamber of claim 11, further comprising a first gas channel extending through the pedestal, wherein the first gas channel is coupled to a vacuum pump.

13. The process chamber of claim 11, further comprising a second gas channel extending from the lower surface of the third plate to a plurality of edge holes in a peripheral region of the first plate to provide a purge gas to an edge of the substrate.

14. The process chamber of claim 11, wherein the thermal baffles form a thin-walled honeycomb shape.

15. The process chamber of claim 11, wherein the lower surface of the first plate is coplanar with the lower surface of the second plate.

\* \* \* \* \*